US012085686B2

(12) United States Patent
Hou et al.

(10) Patent No.: US 12,085,686 B2
(45) Date of Patent: Sep. 10, 2024

(54) SEISMIC INTERFERENCE NOISE ATTENUATION USING DNN

(71) Applicant: CGG SERVICES SAS, Massy (FR)

(72) Inventors: Song Hou, Crawley (GB); Jing Sun, Oslo (NO)

(73) Assignee: CGG SERVICES SAS, Massy (FR)

( * ) Notice: Subject to any disclaimer, the term of this patent is extended or adjusted under 35 U.S.C. 154(b) by 339 days.

(21) Appl. No.: 17/750,467

(22) Filed: May 23, 2022

(65) Prior Publication Data

US 2023/0105075 A1    Apr. 6, 2023

Related U.S. Application Data

(60) Provisional application No. 63/252,895, filed on Oct. 6, 2021.

(51) Int. Cl.
*G01V 1/36* (2006.01)
*G01V 1/28* (2006.01)
*G06F 30/27* (2020.01)

(52) U.S. Cl.
CPC .............. *G01V 1/364* (2013.01); *G01V 1/282* (2013.01); *G06F 30/27* (2020.01); *G01V 2210/324* (2013.01)

(58) Field of Classification Search
CPC .. G01V 1/364; G01V 1/282; G01V 2210/324; G06F 30/27
See application file for complete search history.

(56) References Cited

U.S. PATENT DOCUMENTS

| 11,313,994 B2* | 4/2022 | Salman | G06N 3/08 |
| 11,988,790 B2* | 5/2024 | Aarre | G06T 5/20 |
| 2022/0283329 A1* | 9/2022 | Zwartjes | G01V 1/345 |

FOREIGN PATENT DOCUMENTS

| CN | 108897045 A | 11/2018 |
| CN | 112965113 A | 6/2021 |

OTHER PUBLICATIONS

Xu et al., "Seismic Interference Noise Attenuation by Convolutional Neural Network Based on Training Data Generation", Apr. 2021, IEEE Geoscience, vol. 18, No. 4, pp. 741-745 (Year: 2021).*
Jan H. Kommedal et al., "A case of SI attenuation in 4D seismic data recorded with a permanently installed array," SEG/New Orleans 2006 Annual Meeting, pp. 1-5.
Jing Sun et al., "Attenuation of marine seismic interference noise employing a customized U-Net," Geophysical Prospecting, 2020, vol. 68, No. 3, pp. 845-871.
Jiuying Guo et al., "High-amplitude noise attenuation," SEG Technical Program Expanded Abstracts 2003, 4 pages.

(Continued)

*Primary Examiner* — Elias Desta
(74) *Attorney, Agent, or Firm* — PORTFOLIO BUILDERS BUILDERS PLLC

(57) ABSTRACT

Seismic exploration methods and data processing apparatuses employ a deep neural network to remove seismic interference (SI) noise. Training data is generated by combining an SI model extracted using a conventional model from a subset of the seismic data, with SI free shots and simulated random noise. The trained DNN is used to process the entire seismic data thereby generating an image of subsurface formation for detecting presence and/or location of sought-after natural resources.

20 Claims, 10 Drawing Sheets

(56) References Cited

OTHER PUBLICATIONS

Koray Akbulu et al., "Suppression of Seismic Interference Noise on Gulf of Mexico Data," S10.2, Seismic 10, SEG Technical Program Expanded Abstracts 1984, pp. 527-529.

N. Gülünay et al., "Seismic Crew Interference and Prestack Random Noise Attenuation On 3-D Marine Seismic Data," EAGE 63rd Conference & Technical Exhibition—Amsterdam, The Netherlands, Jun. 11-15, 2001, 4 pages.

N. Gülünay et al., "Seismic interference noise removal," SEG Int'l Exposition and Annual Meeting, San Antonio, Texas, Sep. 9-14, 2001, 4 pages.

Necati Gulunay et al., "Seismic interference noise attenuation," SEG Int'l Exposition and 74th Annual Meeting, Denver, Colorado Oct. 10-15, 2004, pp. 1973-1976.

Olaf Ronneberger et al., "U-Net: Convolutional Networks for Biomedical Image Segmentation," Springer International Publishing Switzerland, 2015pp. 234-241.

S. Jansen et al., "Two Seismic Interference Attenuation Methods Based on Automatic Detection of Seismic Interference Moveout," 75th EAGE Conference & Exhibition incorporating SPE EUROPEC 2013 London, UK, Jun. 10-13, 2013, 5 pages.

Thomas Elboth et al., "Time-frequency seismic data de-noising," Geophysical Prospecting, 2010, vol. 58, pp. 441-453.

V. Vinje et al., "Shooting over the streamer spread: a novel approach in seismic marine acquisition and imaging," TU A4 01, 79th EAGE Conference & Exhibition 2017, Paris, France, Jun. 12-15, 2017, 5 pages.

Wang Huaien et al., "Attenuation of Marine Coherent Noise," SEG Annual Meeting, Dallas, Texas, Oct. 1989, pp. 1112-1114.

Zhigang Zhang et al., "Seismic interference noise attenuation based on sparse inversion," 2015 SEG, SEG New Orleans Annual Meeting, pp. 4662-4666.

Search Report dated Feb. 10, 2023 in corresponding/related British Application No. GB2212374.9.

* cited by examiner

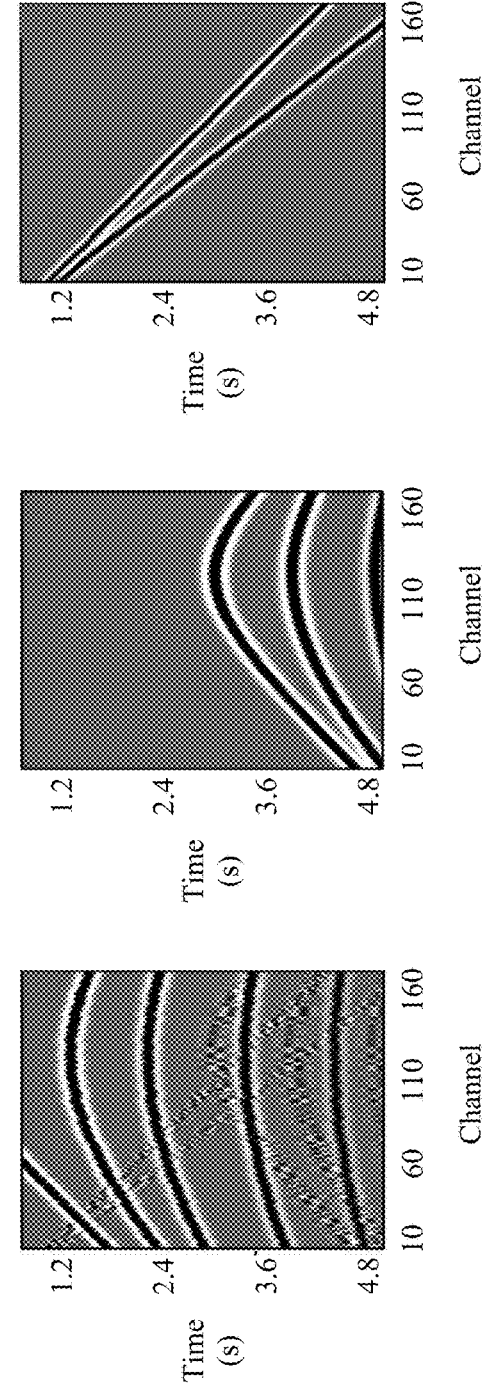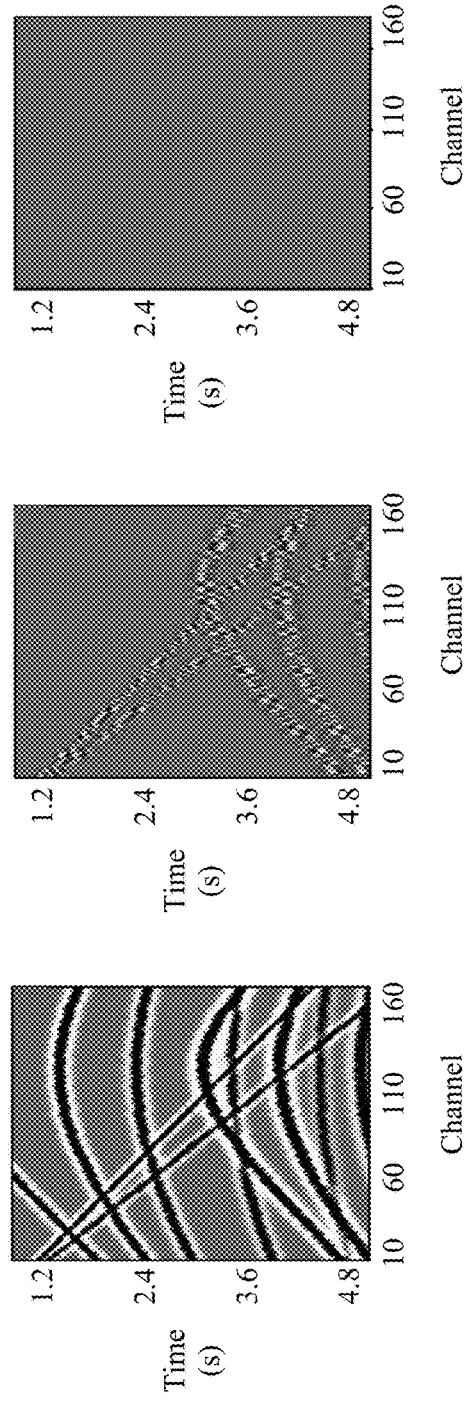

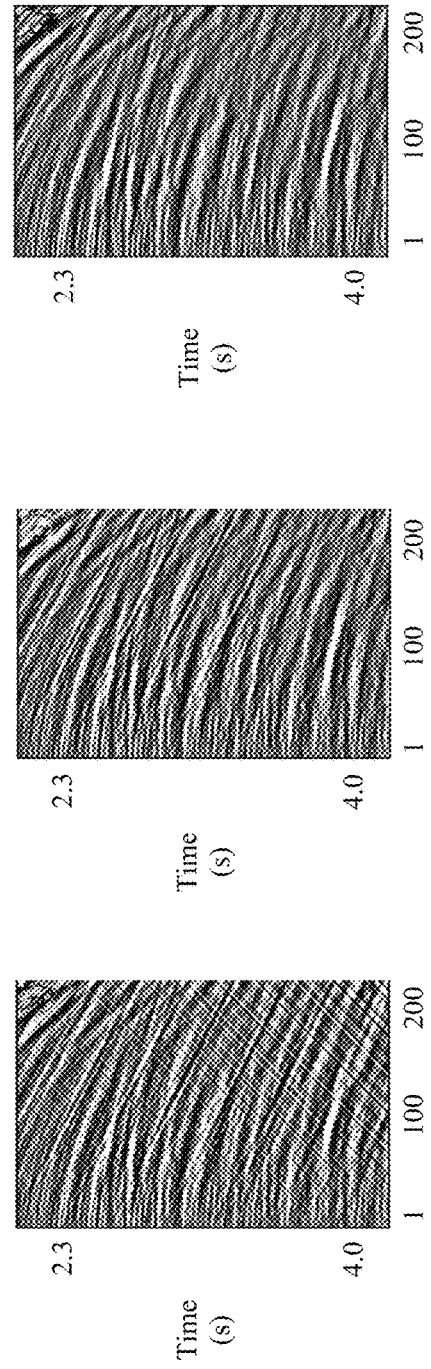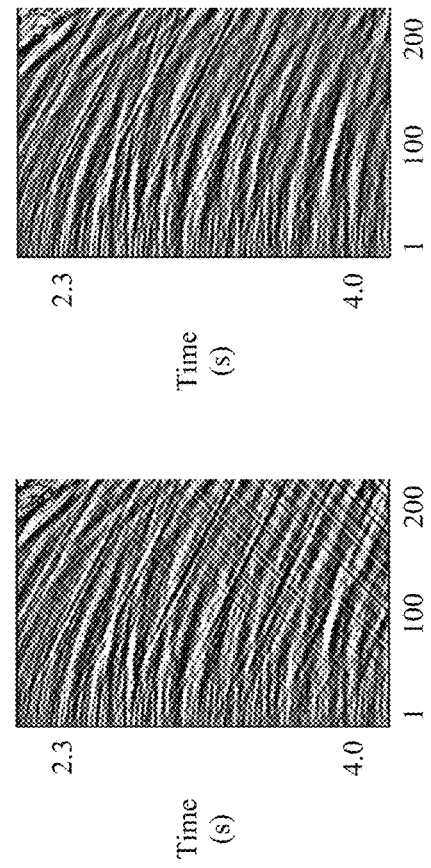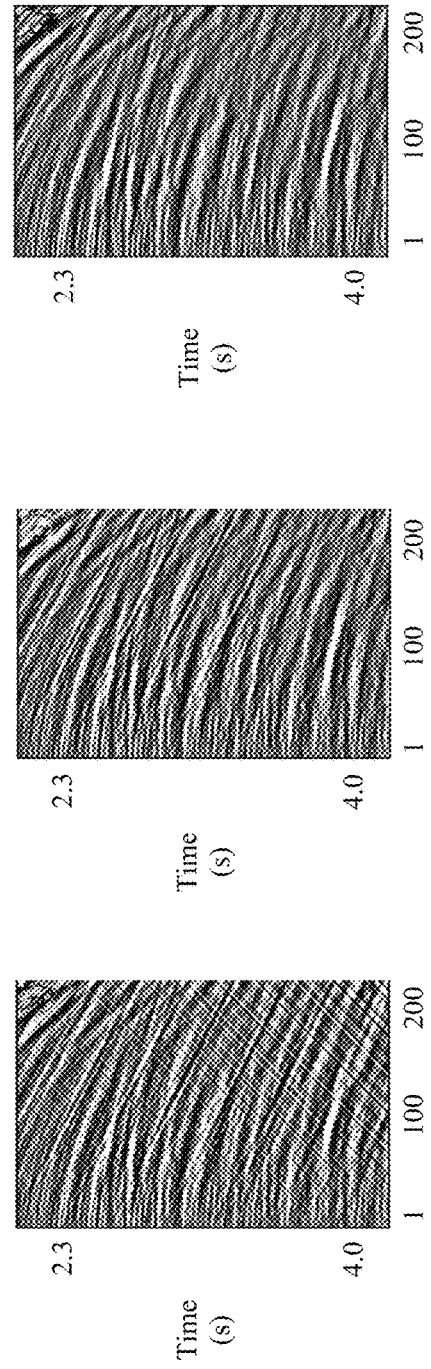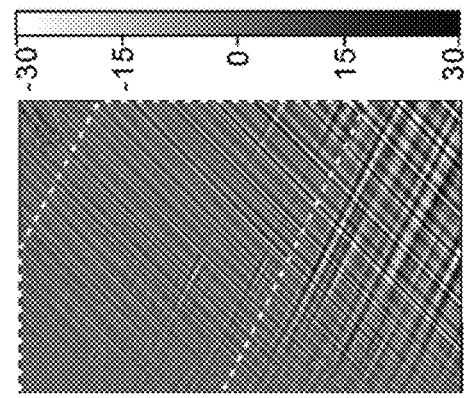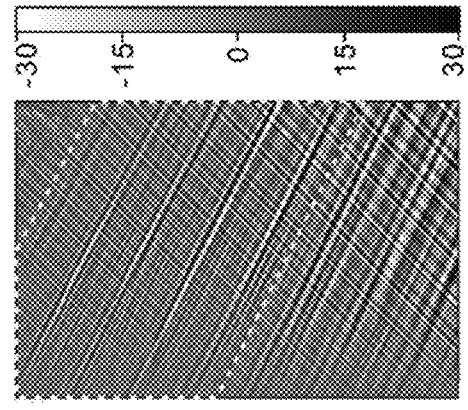
FIGURE 9A
FIGURE 9B
FIGURE 9C
FIGURE 9D
FIGURE 9E

SEISMIC INTERFERENCE NOISE ATTENUATION USING DNN

TECHNICAL FIELD

Embodiments of the subject matter disclosed herein generally relate to seismic exploration of underground formations in which data processing uses a deep neural network (DNN) for attenuating seismic interference noise.

DISCUSSION OF THE BACKGROUND

Exploration geophysics uses physical methods, such as seismic, gravitational, magnetic, electrical and electromagnetic to measure physical properties (such as seismic wave propagation velocity, its asymmetry, etc.) inside a underground formation thereby creating a 3D image of the explored underground formation. The value(s) of one or more physical properties enable detecting the presence and position of economically useful geological deposits, such as rock with sought-after minerals, hydrocarbons, water, etc.

In seismic exploration, seismic data is acquired during a seismic survey. Seismic sensors detecting seismic waves traveling through the explored underground formation record the seismic data. Besides the seismic waves carrying information about the underground formation, the seismic sensors also detect unwanted acoustic energy known as seismic interference (SI) noise. SI, which is typically coherent noise (i.e., bearing a systematic phase relation between adjacent traces), is a significant problem and having a negative impact on seismic data processing operations such as ghost elimination (deghosting), multiple elimination (demultiple), velocity estimations and amplitude versus offset (AVO) analysis (as discussed, for example, in the 2004 article "Seismic interference noise attenuation" by Gulunay et al., published in SEG Technical Program Expanded Abstracts, pp. 1973-1976). The angles of incidence for SI noise may differ from sail line to sail line within one survey depending on the relative placement of the external sources to the receivers. Likewise, the amplitudes of SI noise can also vary greatly depending on the relative distance between the sources and the receivers. As SI noise is generated by powerful dedicated sources for seismic exploration, it tends to be well preserved over large distances and may overlap with reflections from sub-surface layers which have significantly lower amplitudes.

SI noise is typically observed at different arrival times in each seismic shot recording. Therefore, the conventional algorithms for SI noise attenuation often resort to obtaining a more incoherent distribution of the SI noise in the common receiver or common offset domain. Data transformations (e.g., τ-p transform, where p is slope of dt/dx with t being arrival time and x source receiver distance known as "offset," and τ is intercept time obtained, for example, by projecting the slope to x=0) are also commonly adopted in an attempt to discriminate the noise via differences in dips/curvature from underlying signal. After transforming the data, a filtering-based denoising (e.g., the f-x prediction filters, where f is frequency and x is space) may be applied to remove SI noise. However, removing SI noise with different moveout (dip and/or curvature) for an entire dataset requires different sets of parameters be manually tested and selected for applying a conventional algorithm. This process can be laborious. In addition, in some situations (such as when SI noise coming from two directions or with similar dip to the wanted signals is recorded), the conventional algorithms are inadequate leaving noise residual and or loosing signal (i.e., seismic waves carrying information about the underground formation).

In recent years, encouraged by successful applications in conventional image processing, seismic data processing started employing DNNs (deep neural networks) in various seismic data processing operations including SI noise attenuation. Most studies confirmed the advantage of DNN-based approaches in saving time and labor cost and/or improving processing quality by comparing such approaches with a a conventional approach. However, seismic data processing using DNNs have not been widely deployed in actual seismic processing projects because when compared with a production workflow integrating a series of conventional methods of signal processing, the DNN approaches can easily fail to accurately extract the signal.

It remains therefore of interest, in seismic data processing for natural resource exploration in underground formation, to develop DNN-based approaches able to replace high-computing cost conventional algorithms while yielding at least same result quality.

SUMMARY

Methods and devices according to various embodiments perform seismic exploration using a DNN to attenuate/remove SI noise. In order to overcome the problem of potentially inadvertently failing to accurately separate the signal from the noise, the DNN is trained using an SI model, SI free shots and simulated random noise.

According to an embodiment, there is a seismic exploration method that includes selecting a representative subset of a seismic data acquired during a survey and extracting an SI model from the representative subset using a conventional method. The seismic exploration method further includes combining the SI model with SI free shots and simulated random noise to generate a training dataset, training a DNN using the training data, to output the SI model and a sum of the SI free shots and the simulated random noise, and using the trained DNN to process the seismic data in order to generate an image of subsurface formation for detecting presence and/or location of sought-after natural resources.

According to another embodiment, there is a seismic data processing apparatus having an interface configured to obtain seismic data acquired during a survey; and a data processing unit connected to the interface. The data processing unit is configured to select a representative subset of a seismic data acquired during a survey and to extract an SI model from the representative subset using a conventional method. The data processing unit is further configured to combine the SI model with SI free shots and simulated random noise to generate a training dataset, to train a DNN using the training data so that the DNN to output the SI model and a sum of the SI free shots and the simulated random noise, and to use the trained DNN to process the seismic data in order to generate an image of a subsurface formation for detecting presence and/or location of sought-after natural resources.

According to yet another embodiment, there is a computer readable recording medium non-transitorily storing executable codes that when executed by a computer make the computer perform a seismic exploration method. The seismic exploration method includes selecting a representative subset of a seismic data acquired during a survey and extracting an SI model from the representative subset using a conventional method. The seismic exploration method further includes combining the SI model with SI free shots and simulated random noise to generate a training dataset, training a DNN using the training data, to output the SI model and a sum of the SI free shots and the simulated random noise, and using the trained DNN to process the seismic data in order to generate an image of subsurface formation for detecting presence and/or location of sought-after natural resources.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 8A-8F are graphs illustrating the results of a third experiment;

FIGS. 9A-9E are graphs illustrating results obtained using real seismic data.

DETAILED DESCRIPTION

The following description of the exemplary embodiments refers to the accompanying drawings. The same reference numbers in different drawings identify the same or similar elements. The following detailed description does not limit the invention. Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places is not necessarily referring to the same embodiment. Further, the particular features, structures or characteristics may be combined in any suitable manner in one or more embodiments.

The embodiments described in this section relate to the attenuation of noise due to a seismic source other than a primary seismic source. In some cases, the other seismic source is deployed as part of the same data acquisition system (either on the same or another vessel), the noise being called "cross-talk noise." In these cases, the actuation time and position of the seismic source causing the noise are known. In other cases, the seismic source causing the noise is not part of the seismic data acquisition system, the noise may be called seismic interference (SI) noise. In this case the actuation timing and position of the second source are likely unknown. SI noise has typically a lower amplitude than the cross-talk noise, as the noise causing source is likely farther away. The seismic data processing methods and devices described in this section use DNNs for attenuation of SI noise and/or cross-talk noise, while preserving the wanted signal.

Figure 1:
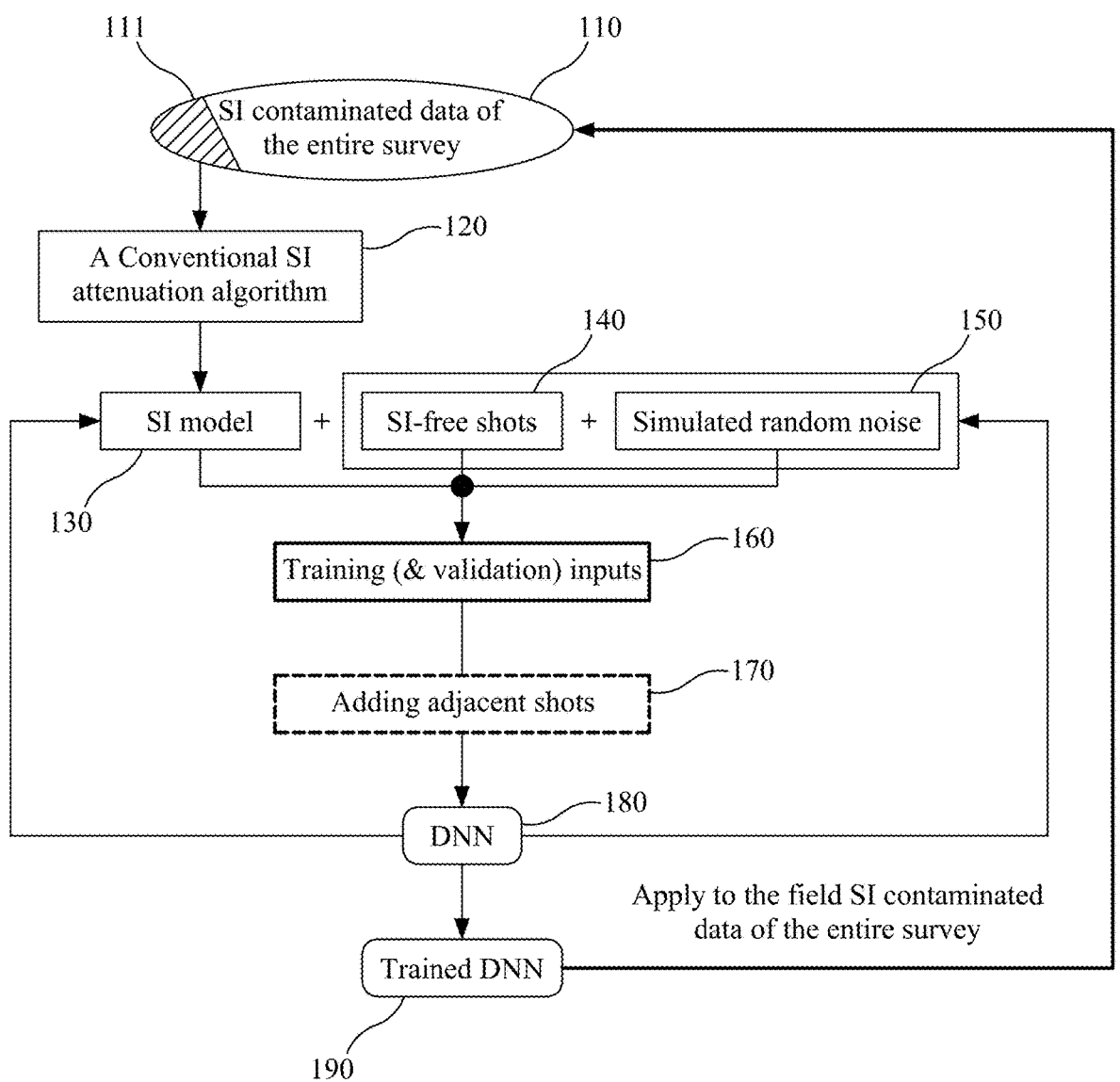
FIG. 1 is a block diagram describing a workflow employing a DNN with supervised learning according to an embodiment.

FIG. 1 is a block diagram describing a workflow employing a DNN with supervised learning according to an embodiment. A subset 111 of the entire acquired dataset 110, which includes information carrying signal and noise, is first processed using a conventional algorithm 120 to obtain an estimate of the SI noise 130 (called hereinafter the "SI model"). Subset 111 is selected to be representative of dataset 110 from in terms of space-time and/or features. Subset 111 may be randomly selected from dataset 110, or based on the location, time and/or other features.

SI model 130 is then combined with SI-free shot data 140 (i.e., corresponding to data acquired without SI noise in the survey area, the SI-free shot data being obtained by simulation or a result of conventional SI-removal) and simulated random noise 150. The resulting blended data is used as input for training and validation 160 of the DNN 180. Injecting additional random noise into the input makes the DNN to better focus on learning the high-level features of the input data. DNN 180 learns to predict two outputs: a first one corresponding to the SI noise and a second one corresponding to the SI-free shot and the random noise (as indicated by the arrows emerging from DNN 180 box and turning back to SI model 130 and the box surrounding SI-free shot data 140 and simulated random noise 150, respectively). In other words, DNN 180 may be trained so its first channel output to match SI model 130 and its second channel output to match the sum of SI-free shot data 140 and simulated random noise 150. Note that here the term 'channel' is used in the machine learning sense to represent a certain component of an image. DNN 180 may be output any or both these channels as well as other similar user-defined channels.

Optionally (as indicated by the dashed line of box 170), DNN training and validation may also use adjacent shots on both sides (location-wise or time-wise) of the reference shot are added to the DNN's input (as described, for example, in the 2020 article "Attenuation of marine seismic interference noise employing a customized U-Net" by Sun et al. published in *Geophysical Prospecting*, vol. 68, no. 3). When adjacent shots are used, although the input data slices are in shot domain, the DNN may then also use of information in the common receiver domain since seismic events from consecutive shots are correlated and continuous whereas the SI noise tends to be uncorrelated and discontinuous.

Once the DNN is adequately trained (i.e., 190), it can be used to process the entire acquired dataset 110 without injecting additional random noise. The output of the processing using DNN is then a dataset without SI noise.

Figure 2:
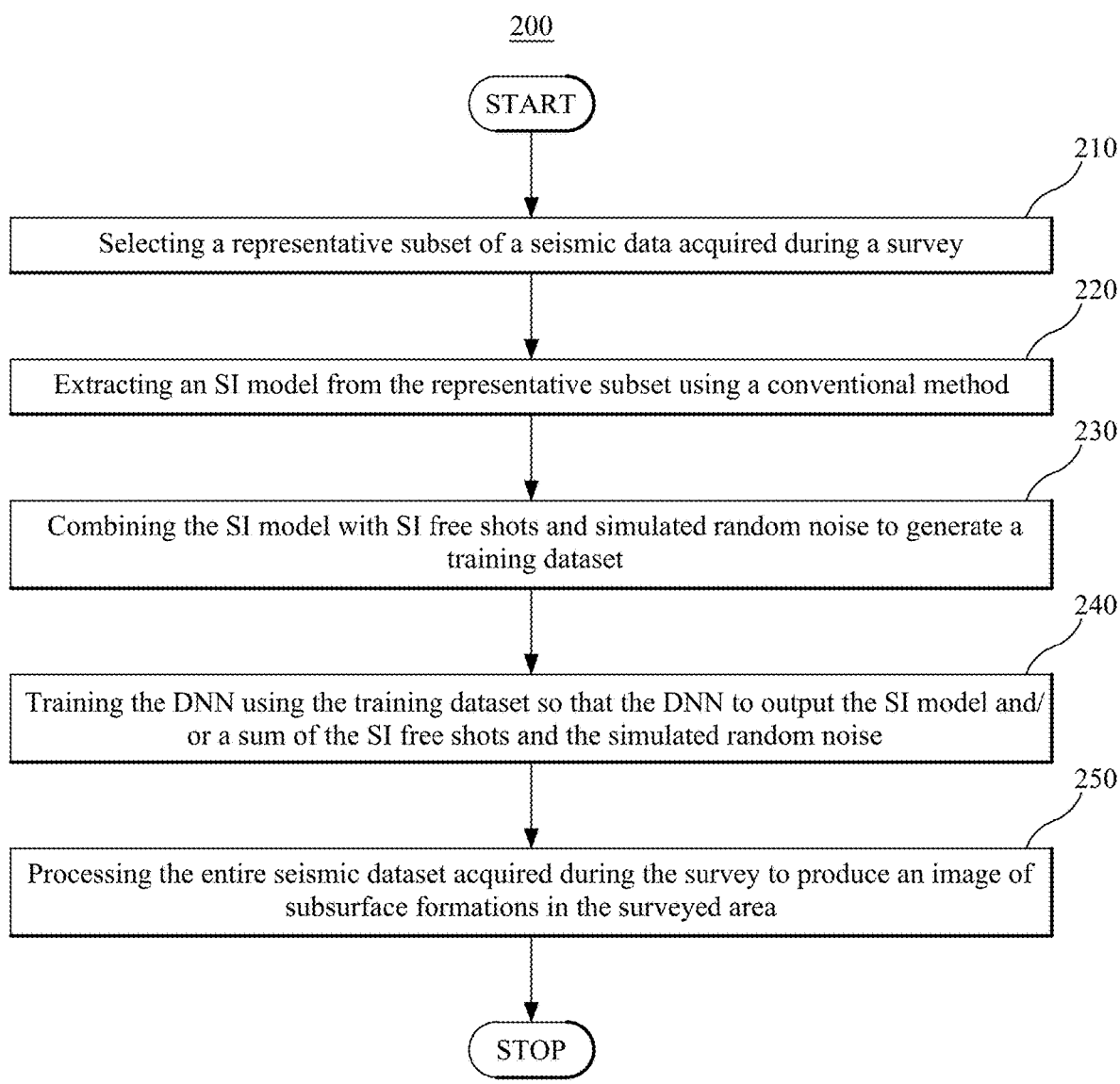
FIG. 2 is a flowchart of a seismic exploration method according to an embodiment.

FIG. 2 is a flowchart of a seismic exploration method (200) according to an embodiment. Method 200 includes selecting a representative subset of a seismic data acquired during a survey at 210. The subset may be, for example, less than 10% of the entire dataset, and may be obtained by subsampling traces recorded by a receiver, or considering only data acquired by certain receivers, or less than 10% of the data associated with a pair of horizontal coordinates, etc.

Method 200 further includes extracting an SI model from the representative subset using a conventional method at 220. Here, the "conventional method" may be an inversion-type method that optimizes the subsurface structure's model, a transformation-type method (e.g., a data transform followed by a filter-based denoising) or direct noise identification in a subset of the survey data without a primary signal (e.g., during in the line turns, from noise records before the start of a line or after shooting a line, while transiting to infill lines, etc.).

Method 200 then includes combining the SI model with SI free shots and simulated random noise to generate a training dataset at 230. The SI free shots may be simulated or may be the result of applying a conventional method. Then, at 240, a DNN is trained (using as input the training dataset) to output the SI model and/or a sum of the SI free shots and the simulated random noise.

Method 200 may include splitting a dataset resulting from combining the SI model with SI free shots and simulated random noise into a validation dataset and the training dataset, and after the DNN is trained using the training dataset, DNNs accuracy is tested using the validation dataset.

Method 200 uses the trained DNN to process the entire seismic dataset acquired during the survey to produce an image of subsurface formations in the surveyed area at 250. The image represents attribute values (e.g., seismic wave propagation velocity, reflectivity, etc.) within the subsurface enabling detection of sought-after natural resources (e.g., oil and gas, geothermal water, minerals, etc.).

Besides attenuating noise due to external sources (other than the ones yielding the primary signal), this method may be applied to attenuate turn noise, shear-like noise caused by scattering off sea-floor heterogeneities (known as "Vz noise"), cable strum noise, multiples, ghosts, bubble noise, etc.

Figure 3:
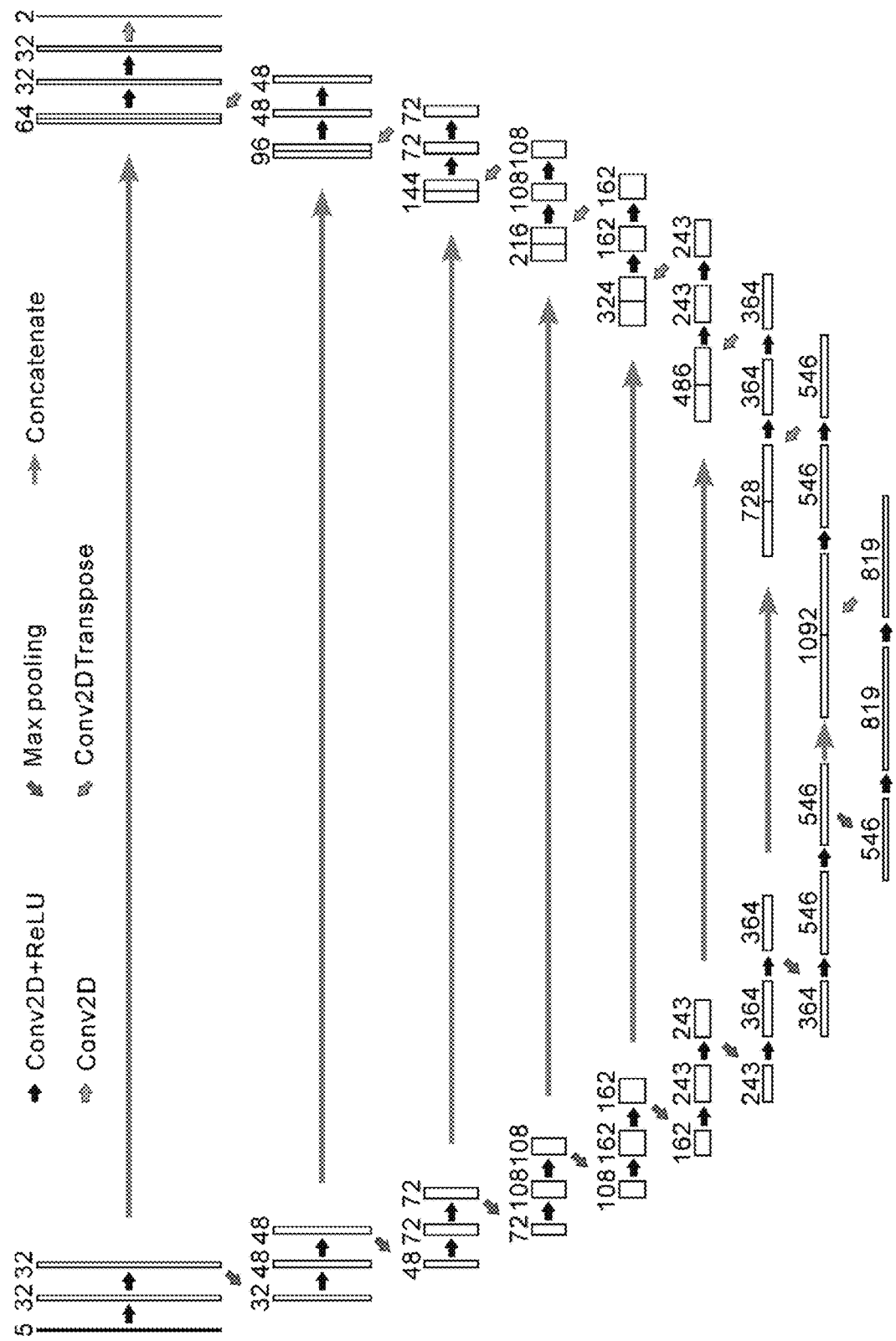
FIG. 3 illustrates a DNN architecture.

DNN is a term used to describe hardware such as network nodes and software such as machine learning algorithms. DNNs have an input layer, an output layer and few hidden layers in-between. DNNs have a hierarchical organization similar to neurons in human brains. DNNs consist of neurons, synapses, weights, biases, and functions. DNNs are trained to yield desired outputs by supervised learning with an input/training dataset and one or more target output(s) (in our case, (i) the SI model and/or (ii) a sum of the SI free shots and the simulated random noise) through back propagation. FIG. 3 exemplarily illustrates a DNN architecture. Each box therein represents a collection of feature maps from a previous layer and the numbers above the boxes represent the number of feature maps calibrated during training. The various symbols (Conv2D, Conv2D+ReLU, Max Pooling, Conv2DTranspose, Concatenate) are functions.

Figure 4A:
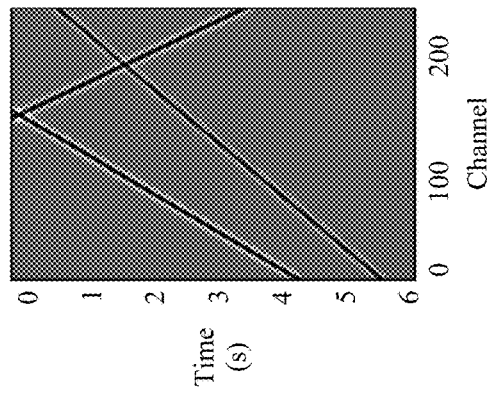
FIGS. 4A-4E are graphs illustrating synthetic data used to test accuracy of DNN usage.
Figure 4B:
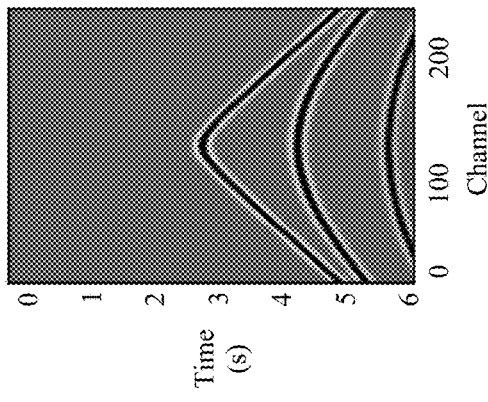
Figure 4C:
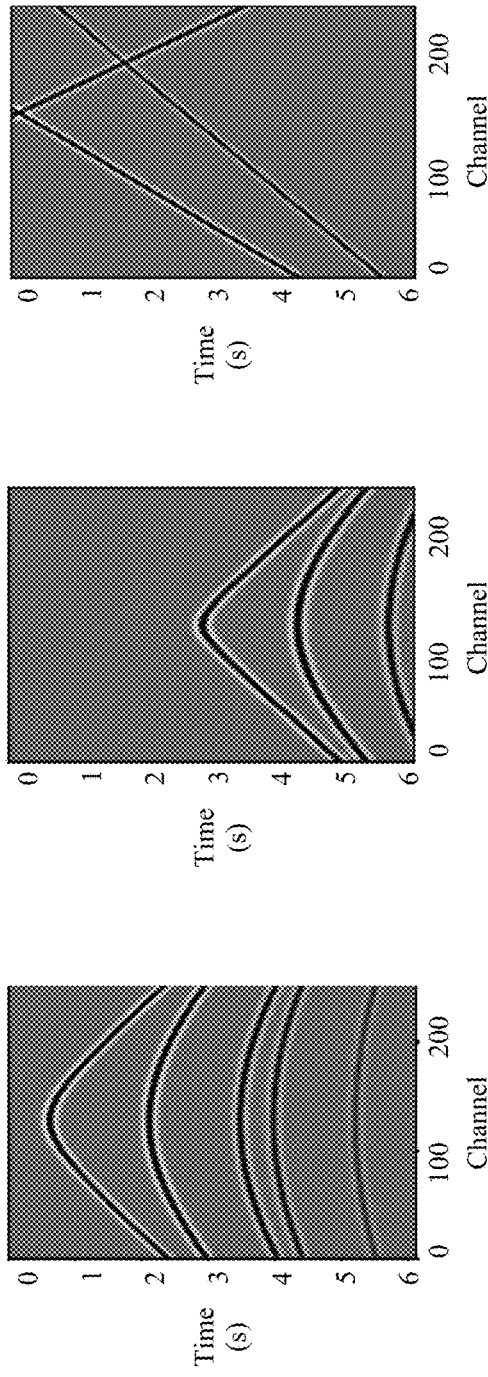
Figure 4E:
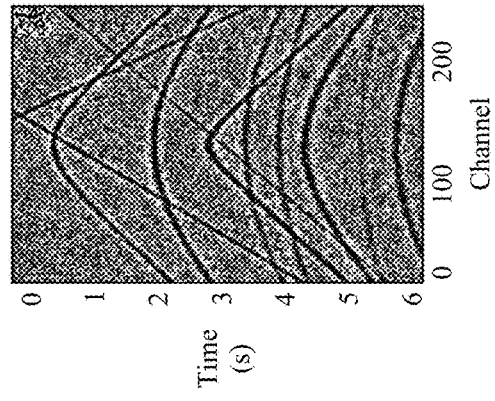
Figure 4D:
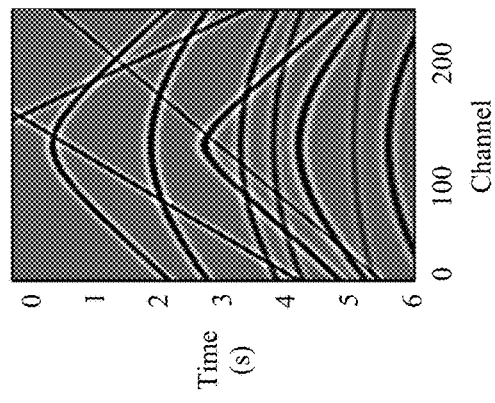

SI noise attenuation using DNNs as described above was tested using synthetic (simulated) data illustrated in FIGS. 4A-4E (i.e., graphs with travel time corresponding to depth increasing downwards on vertical axis, channels corresponding to horizontal coordinate on horizontal axis and signal amplitude represented as nuances of gray). FIG. 4A represents the primary-source signal, FIG. 4B is blended noise due to coherent energy from other shot(s) fired in later time and FIG. 4C represents a linear noise due, for example, to seismic interference, surface waves, other shot than the shot subject to SI removal or another distant shot at a different location than the shot subject to SI removal. FIG. 4D illustrates data resulting by adding the signals in 4A-4C, and FIG. 4E represents data in FIG. 4D contaminated by random noise, thereby, simulating real data acquired by a blended data acquisition system. The DNN is trained to separate the three signals i.e., FIGS. 4A, 4B and 4C from their mixture contaminated with random noise (as in FIG. 4E), in the shot domain.

The simulated primary-source signals and blending noise both have events of hyperbolic curvatures as if being acquired from a source-over-streamer blended seismic data acquisition (e.g., using TopSeis system described in the 2017 article "Shooting over the streamer spread: a novel approach in seismic marine acquisition and imaging" by Vinje et al. published in 79th Annual Conference and Exhibition, EAGE, Extended Abstracts, pp. 1-5). For a shooting interval of 3.0 s with a shot-to-shot dithering of maximum ±500 ms, a blended data batch of 300 blended shots (primary-source signal plus blending noise) have been simulated. The shots in this batch have different numbers of linear events with different dips and amplitudes. Other thirty blended shots were generated using a slightly different shooting interval, 24 of which were then used as DNN training data and the other 6 were for validation.

Figure 5A:
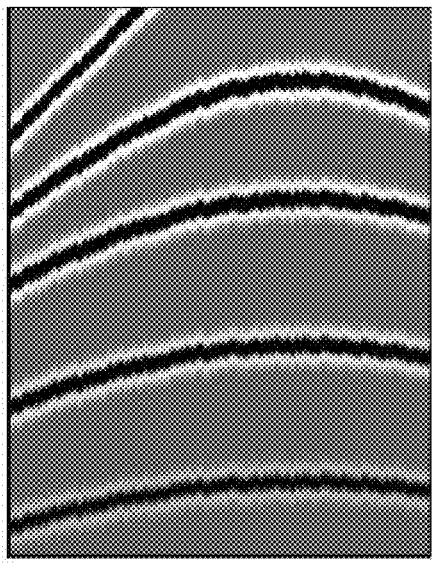
FIGS. 5A-5D are graphs illustrating synthetic data with jitter used to test accuracy of DNN usage.
Figure 5B:
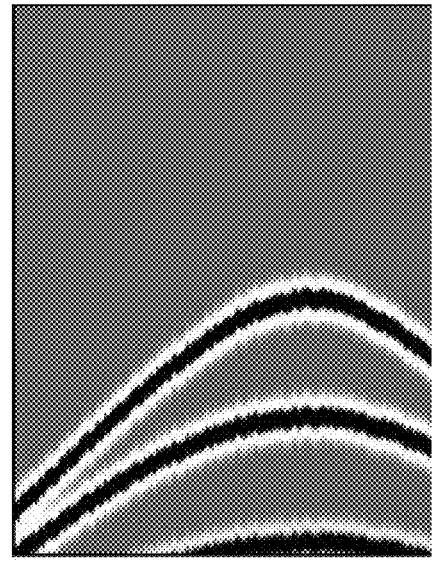
Figure 5C:
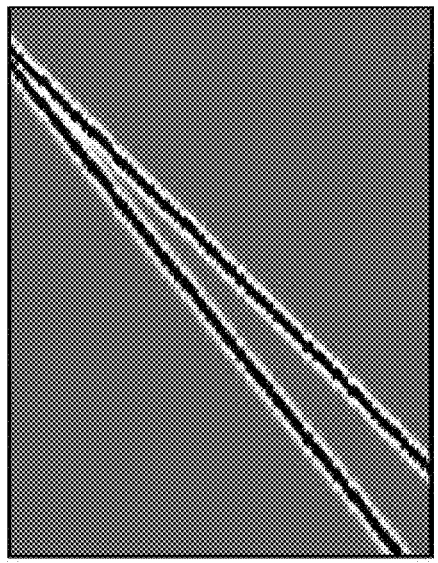
Figure 5D:
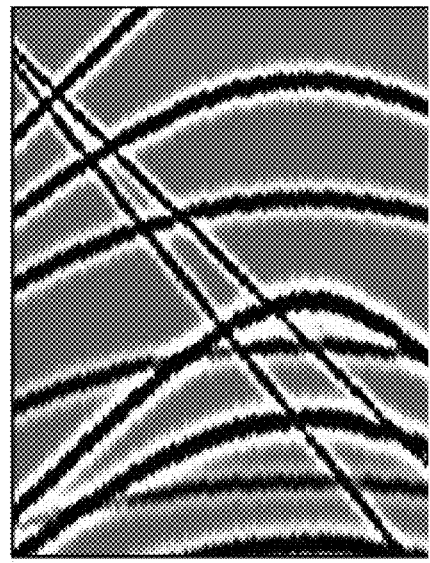

Jittered gathers obtained by applying a random dither on each trace may be used as test data. FIGS. 5A, 5B and 5C are graphs illustrating portions (time range is 1.2 to 4.8 s while it is 0-6 s for FIG. 4, and only channels 10-170 are illustrated while the range is 0-240 channels for FIG. 4) of the signals in FIG. 4 (i.e., the primary-source signal, blending noise and linear noise) with local jitters applied on an event-by-event basis. FIG. 5D is the sum of the signals in 5A, 5B and 5C. The local jitters are added to provide visible low-level features for testing. In deep learning, data features are divided into low- and high-levels features. High-level features (e.g., global curvatures of the seismic events) are more representative, then the low-level features such as local jitters. The performance of a trained DNN model is indicated by ability to handle the low-level versus high-level features.

Three experiments for testing the use of DNNs for the attenuating SI noise were conducted.

Figure 6C:
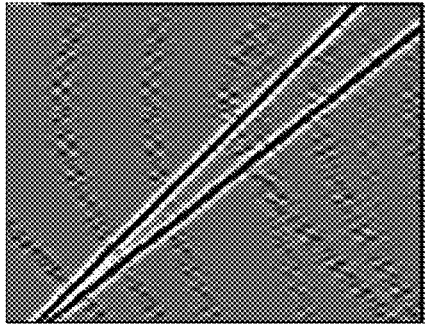
FIGS. 6A-6F are graphs illustrating the results of a first experiment.
Figure 6F:
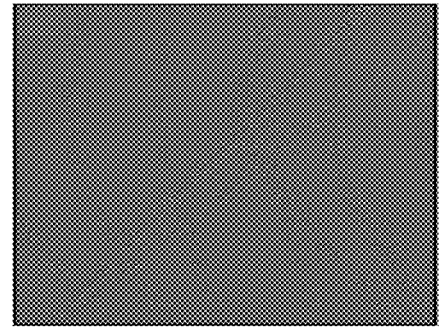
Figure 6B:
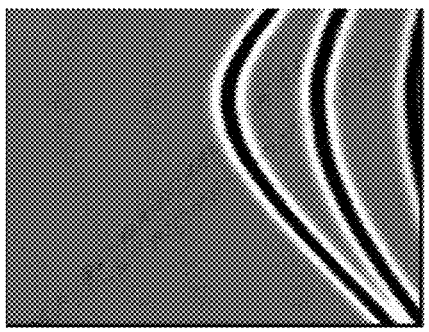
Figure 6E:
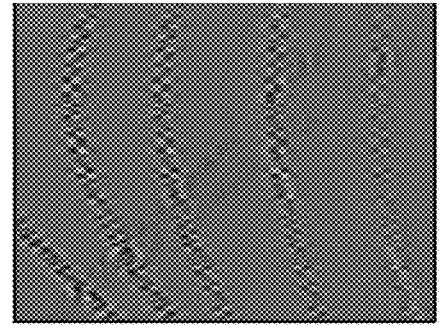
Figure 6A:
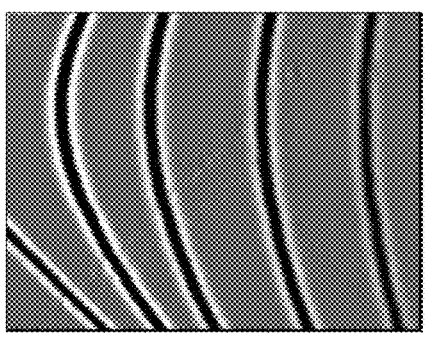
Figure 6D:
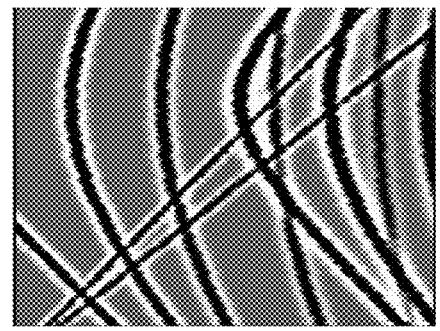

The first experiment used the unjittered signals (FIGS. 4A, 4B, 4C) and their sum (FIG. 4D) to train the DNN. Once trained, the DNN was used to process data in FIG. 5D. The outputs corresponding to the primary-source signal, the blending noise and linear noise are shown in FIGS. 6A, 6B and 6C, respectively. FIG. 6D which is the summation of 6A, 6B and 6C, is very close to FIG. 5D. The differences between the signals in FIGS. 5A and 6A corresponding to the primary-source signal is illustrated in FIG. 6E and the difference between FIG. 5D and FIG. 6D corresponding to the sum of the primary signal is illustrated in FIG. 6F. The blended noise and the linear noise are illustrated in FIGS. 6B and 6C, respectively. Residuals of the local jitter in FIG. 6E (i.e., the difference between true and predicted primary-source signal) is visible, but no residuals are visible in FIG. 6F corresponding to the summation of three signal. The performance of the trained DNN here is similar to a decomposition problem in conventional signal processing. Therefore, this type of processing pattern is named "decomposition pattern".

In the second experiment, random noise, which lacks learnable high-level features, was added to first training data set (i.e., input for training was FIG. 4E), but the DNN was not required to predict the additional random noise. The random noise may be uniform in frequency, but could also be gaussian noise (characterized by a gaussian energy distribution as function of frequency), a white noise, a pink noise (having a frequency spectrum such that the power spectral density is inversely proportional to the frequency), a black noise (with zero energy at most frequencies and occasional sudden rises), a brownian (having a frequency spectrum such that the power spectral density is inversely proportional to the square of frequency), or a cauchy noise (impulsive and non-gaussian energy distribution as function of frequency). The random noise has to be strong enough to be identified by the DNN for training yet not too strong to mask the target signals (e.g., in FIGS. 4A-4C). For example, the random noise may be 0.1% to 10% of the primary signal level.

Figure 7C:
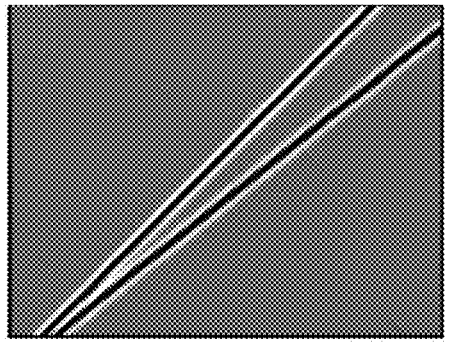
FIGS. 7A-7F are graphs illustrating the results of a second experiment.
Figure 7B:
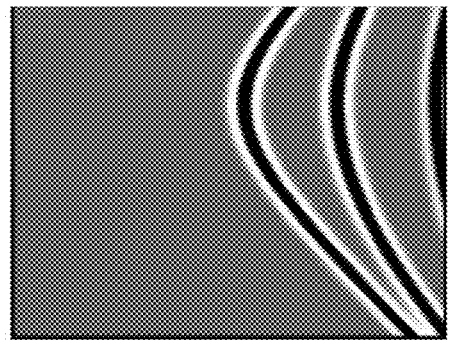
Figure 7A:
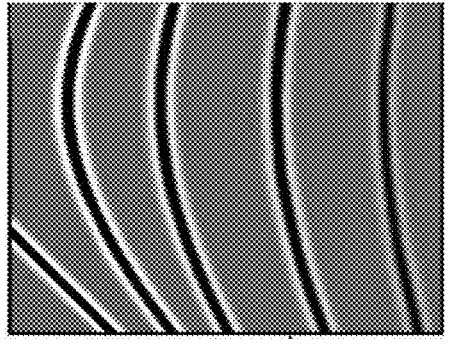
Figure 7F:
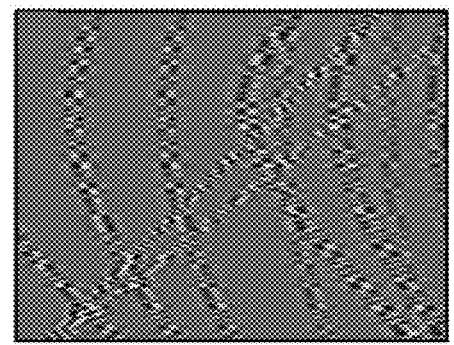
Figure 7E:
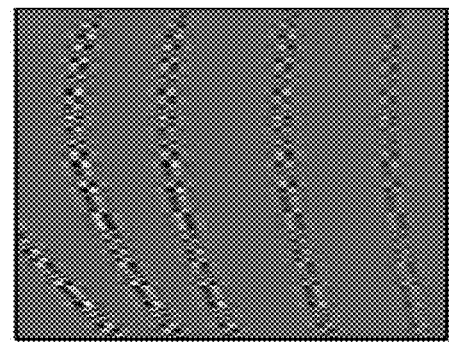
Figure 7D:
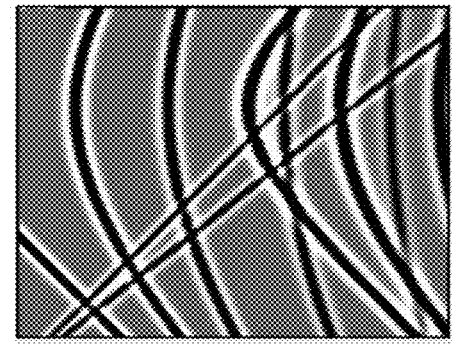

In this second experiment, the DNN was trained to output the three coherent components free of random noise and jitter (i.e., as in FIGS. 4A-4C). The trained DNN was tested on the same data as Experiment 1 (i.e., FIG. 5D which is sum of the signals with jitter but without random noise). The trained DNN outputs corresponding to primary-source signal, blending noise and linear noise are illustrated in FIGS. 7A, 7B and 7C, respectively, while their summation is shown in FIG. 7D. The DNN trained in this second experiment managed to reconstruct shapes and curvatures of the coherent components at correct positions but lost all the local jitters on their events. Similar to FIGS. 6E and 6F, FIGS. 7E and 7F are the residuals, that is the difference between FIGS. 7A and 5A, and 7D and 5D respectively. Presence/absence of learnable high-level features is the essential difference between the coherent components which are supposed to be predicted and the random noise which is supposed to be removed. Therefore, in this case, the DNN focused more on using the high-level features of all the data components to achieve the signal separation, which led to naturally/automatically dropping the random noise. The results of this second experiment demonstrated the possibility of driving the DNN's estimation of data components toward emphasizing their high-level features. Since this training and use pattern of the DNN worked similarly to sparsity-promoting transforms in conventional seismic processing (which reconstruct data from a sparse representation), this pattern type of processing pattern is named "reconstruction pattern."

Experiment 3 builds on experiment 2 retaining the random noise along with the wanted signal in its corresponding output channel in addition to injecting random noise into the training input. The random noise was uniform random noise, but may also be gaussian white, pink, black, brownian, or cauchy noise. The goal was to maintain the benefits of predicting coherent noise through the reconstruction pattern, so that a more complete prediction can be achieved based on a better extraction of the high-level features, while avoiding loss of the desired signal (e.g., the local jitters on the events). Note that real field seismic data do not always have dramatic low-level features like these artificially introduced local jitters, either on the desired signal or the coherent noise, but it is still important to preserve information of the raw data as complete as possible during the processing.

The results (primary signal, blending noise and linear noise) output by the DNN trained in experiment 3 are illustrated in FIGS. 8A, 8B and 8C. While the outputs of the DNNs trained in experiment 2 and in experiment 3, respectively, are about the same for blending noise (compare FIGS. 7B and 8B) and linear noise (compare FIGS. 7C and 8C), a dramatic decrease of the quality is noted for the primary-source signal output in experiment 3 (compare FIGS. 7A and 8A) due to the presumed presence or absence of random noise in that channel. The lack of high-level features of random noise made it impossible to reconstruct the output channel where the random noise was to be retained. Consequently, the DNN yields a primary-signal output rather by subtracting the other two reconstructed random-noise-free (FIGS. 8B and 8C) from the input (FIG. 5D). The training and use pattern of the DNN is therefore named "subtraction pattern." Similar to FIGS. 6E and 6F and to FIGS. 7E and 7F, FIGS. 8E and 8F are the residuals for the primary signal and the sum of the primary signal, blended and linear noise, respectively. The local jitters on the primary-source signal are well preserved in FIG. 8A, and the local jitters belonging to the blending noise and linear noise were left in FIG. 8E. After adding the outputs in FIGS. 8A, 8B and 8C, the local jitters reoccurred on all the three coherent components in FIG. 8D. There is almost no difference with the test input (FIG. 5D) as shown in FIG. 8F.

These three experiments with their respective training and using DNN patterns lead to improving and nuancing the use of DNNs for removing SI noise. In experiment 1, since the DNN simply decomposes the random noise-free input seismic to the different components, loss of data features occurs in each of them but their summation is approximately equal to the raw input. In experiment 2, in which random noise is injected into the training inputs and the DNN learns to reconstruct output channels free of random noise, DNN is more focused on learning the high-level features of data, but some low-level features (e.g., the local variance of amplitude and time-shift) were overlooked. Experiment 3 showed that if one output (here, the primary-source signal) is expected to keep not only one coherent component but also the random noise, the DNN tends to reconstruct the other random noise-free changes first. The channel with random noise may then be obtained by subtracting the reconstructed channels from the raw data. This pattern better preserves signal fidelity of the coherent component in a selected channel at the expense of adding jitter from the other channels interpreted as random noise.

The above three processing patterns could be selectively used for different purposes based on their own trade-offs. If the goal is to achieve good signal fidelity and preserve primary information, it is advantageous to inject random noise into primary signal data used as input and the output channel for training the DNN.

Following up on experiment 3, applied to a real data test, to train the DNN, SI contaminated data was produced by randomly blending SI-free shots with records containing almost pure SI noise originating from different directions as illustrated in FIG. 9A. The training and validation data sets consisted of 7000 and 1000 images respectively. The blended data was fed into the DNN as training and validation inputs as in Experiment 1. The targeted outputs were the SI-free shots (illustrated in FIG. 9B) and the signal-free SI noise (illustrated in FIG. 9D).

The DNN was trained with data in which identical simulated random noise was injected into the training (and validation) inputs. After being independently trained, this DNN was applied on the same set of field data contaminated by SI noise during acquisition. Compared to the reference case (FIG. 9D), the DNN in this case yielded a significantly more complete and accurate SI noise (illustrated in FIG. 9E). Correspondingly, the fidelity of primary signal (illustrated in FIG. 9C was also significantly improved with much less signal leakage than in the reference case.

The main advantage of using DNNs is seismic data processing is significantly decreasing the processing time. Training the DNN with data prepared as discussed (i.e., extracting an SI model from the representative subset using a conventional method and then combining the SI model with SI free shots and simulated random noise) yield accurate results both for simulated and real seismic data.

Figure 10:
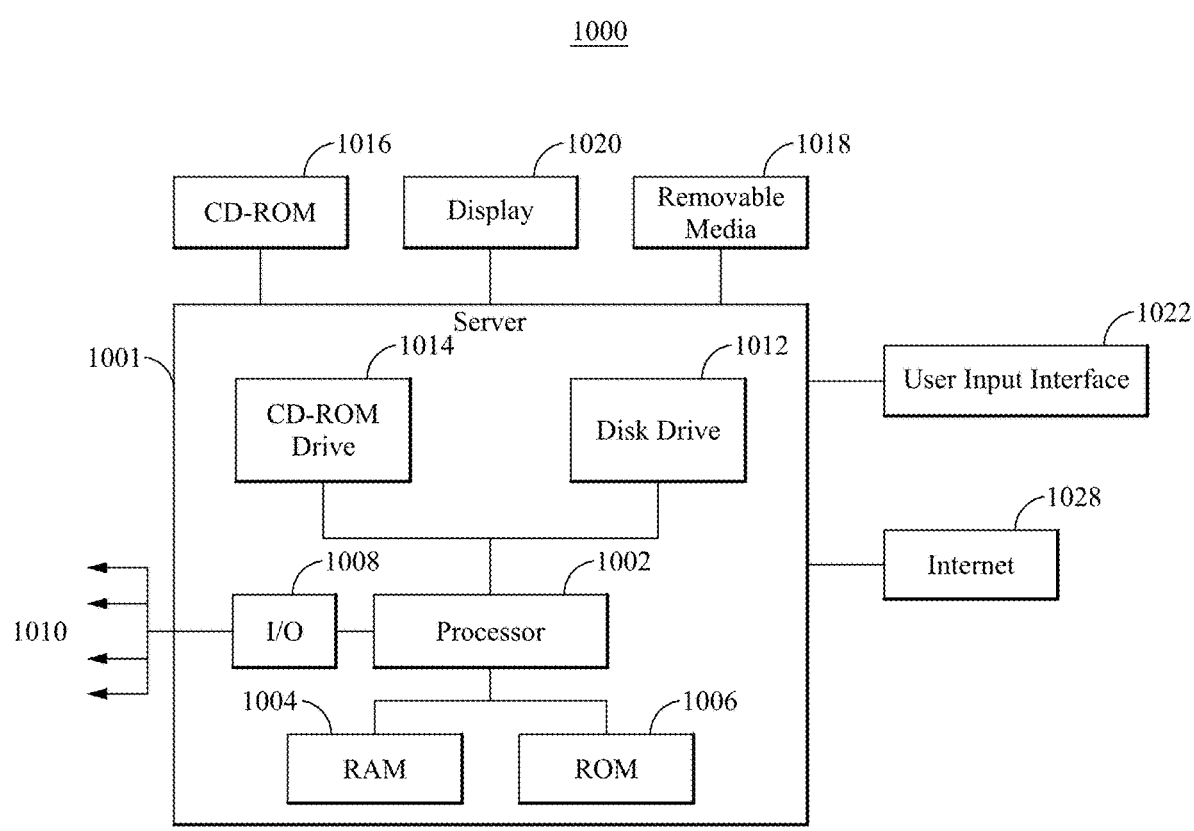
FIG. 10 is a block diagram of a seismic data processing apparatus, according to an embodiment.

The above-discussed methods may be implemented in a computing device 1000 as illustrated in FIG. 10. Hardware, firmware, software or a combination thereof may be used to perform the various steps and operations of the above-described methods/techniques.

Computing device 1000 suitable for performing the activities described in the exemplary embodiments may include a server 1001. Server 1001 may include a central processor (CPU or GPU) 1002 coupled to a random-access memory (RAM) 1004 and to a read-only memory (ROM) 1006. ROM 1006 may also be other types of storage media to store programs, such as programmable ROM (PROM), erasable PROM (EPROM), etc.

Processor 1002 may communicate with other internal and external components through input/output (I/O) circuitry 1008 and bussing 1010 to provide control signals and the like. The I/O circuitry 1008 is configured to obtain seismic data acquired during a survey. Processor 1002 carries out a variety of functions as are known in the art, as dictated by software and/or firmware instructions. The processor is configured to select a representative subset of a seismic data acquired during a survey, to extract an SI model from the representative subset using a conventional method, to combine the SI model with SI free shots and simulated random noise to generate a training dataset, to train a DNN using the training data so that the DNN to output the SI model and a sum of the SI free shots and the simulated random noise, and to use the trained DNN to process the seismic data in order to generate an image of subsurface formation for detecting presence and/or location of sought-after natural resources.

RAM 1004 may be configured to store executable codes that when executed by a computer make the computer perform a seismic exploration method such as method 200 and its variations described in this section.

Server 1001 may also include one or more data storage devices, including hard drives 1012, CD-ROM drives 1016 and other hardware capable of reading and/or storing information, such as DVD, etc. In one embodiment, software for carrying out the above-discussed steps may be stored and distributed on a CD-ROM or DVD 1016, a USB storage device 1018 or other form of media capable of portably storing information. These storage media may be inserted into, and read by, devices such as CD-ROM drive 1014, disk drive 1012, etc. Server 1001 may be coupled to a display 1020, which may be any type of known display or presentation screen, such as LCD, plasma display, cathode ray tube (CRT), etc. A user input interface 1022 is provided, including one or more user interface mechanisms such as a mouse, keyboard, microphone, touchpad, touch screen, voice-recognition system, etc.

Server 1001 may be coupled to other devices, such as sources, detectors, etc. The server may be part of a larger network configuration as in a global area network such as the Internet 1028, which allows ultimate connection to various computing devices.

The embodiments described in this section set forth methods and devices configured to attenuate/remove SI noise fast and accurately using a DNN. It should be understood that this description is not intended to limit the invention. On the contrary, the exemplary embodiments are intended to cover alternatives, modifications and equivalents, which are included in the spirit and scope of the invention. Further, in the detailed description of the exemplary embodiments, numerous specific details are set forth in order to provide a comprehensive understanding of the invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. Other examples that occur to those skilled in the art are intended to be within the scope of the disclosed inventions.

What is claimed is:

1. A seismic exploration method, the method comprising:
    selecting a representative subset of a seismic data acquired during a survey;
    extracting a seismic interference, SI, model from the representative subset using a conventional method;
    combining the SI model with SI free shots and simulated random noise to generate a training dataset;
    training a deep neural network, DNN, using the training data so that the DNN to output the SI model and a sum of the SI free shots and the simulated random noise; and
    using the trained DNN to process the seismic data in order to generate an image of subsurface formation for detecting presence and/or location of sought-after natural resources.

2. The seismic exploration method of claim 1, wherein adjacent shots are included in the training data.

3. The seismic exploration method of claim 1, further comprising:
    splitting a dataset resulting from combining the SI model with the SI free shots and the simulated random noise into a validation dataset and the training dataset; and
    testing the trained DNN using the validation dataset.

4. The seismic exploration method of claim 1, wherein the random noise has a uniform energy distribution as function of frequency.

5. The seismic exploration method of claim 1, wherein the random noise is a gaussian noise, a pink noise, a black noise, a Brownian noise or a Cauchy noise.

6. The seismic exploration method of claim 1, wherein the SI noise is due to an external secondary source.

7. The seismic exploration method of claim 1, wherein the SI noise includes at least one of turn noise, Vz noise, cable strum noise, multiples, ghosts and bubble noise.

8. The seismic exploration method of claim 1, wherein the conventional method includes a data transform followed by a filter-based denoising.

9. A seismic data processing apparatus comprising:
    an interface configured to obtain seismic data acquired during a survey; and
    a data processing unit connected to the interface and configured
        to select a representative subset of a seismic data acquired during a survey,
        to extract a seismic interference, SI, model from the representative subset using a conventional method,
        to combine the SI model with SI free shots and simulated random noise to generate a training dataset,
        to train a deep neural network, DNN, using the training data so that the DNN to output the SI model and a sum of the SI free shots and the simulated random noise, and
        to use the trained DNN to process the seismic data in order to generate an image of subsurface formation for detecting presence and/or location of sought-after natural resources.

10. The seismic data processing apparatus of claim 9, wherein the data processing unit includes adjacent shots in the training data.

11. The seismic data processing apparatus of claim 9, wherein the data processing unit is further configured to split a dataset resulting from combining the SI model with the SI free shots and the simulated random noise into a validation dataset and the training dataset, and to test the trained DNN using the validation dataset.

12. The seismic data processing apparatus of claim 9, wherein the random noise has a uniform energy distribution as function of frequency.

13. The seismic data processing apparatus of claim 9, wherein the random noise is a gaussian noise, a pink noise, a black noise, a Brownian noise or a Cauchy noise.

14. The seismic data processing apparatus of claim 9, wherein the SI noise is due to an external secondary source.

15. The seismic data processing apparatus of claim 9, wherein the SI noise includes at least one of turn noise, Vz noise, cable strum noise, multiples, ghosts and bubble noise.

16. The seismic data processing apparatus of claim 9, wherein the conventional method includes a data transform followed by a filter-based denoising.

17. A computer readable recording medium non-transitorily storing executable codes that when executed by a computer make the computer perform a seismic exploration method, the method comprising:

selecting a representative subset of a seismic data acquired during a survey;

extracting a seismic interference, SI, model from the representative subset using a conventional method;

combining the SI model with SI free shots and simulated random noise to generate a training dataset;

training a deep neural network, DNN, using the training data, to output the SI model and a sum of the SI free shots and the simulated random noise; and using the trained DNN to process the seismic data in order to generate an image of subsurface formation for detecting presence and/or location of sought-after natural resources.

18. The computer readable recording medium of claim 17, wherein adjacent shots are included in the training data.

19. The computer readable recording medium of claim 17, wherein the method further comprises:

splitting a dataset resulting from combining the SI model with SI free shots and the simulated random noise into a validation dataset and the training dataset; and testing the trained DNN using the validation dataset.

20. The computer readable recording medium of claim 17, wherein the SI noise includes at least one of turn noise, Vz noise, cable strum noise, multiples, ghosts and bubble noise.

\* \* \* \* \*